(12) United States Patent
Takano et al.

(10) Patent No.: US 9,099,640 B2
(45) Date of Patent: Aug. 4, 2015

(54) TRANSDUCER FOR ULTRASONIC MOTOR

(75) Inventors: Masahiro Takano, Kanazawa (JP);
Kenichi Hirosaki, Kanazawa (JP); Yuta Yoshida, Kanazawa (JP); Takuya Nagata, Hakusan (JP); Shou Makino, Hakusan (JP); Satoru Ichimura, Hahusan (JP); Takashi Yoshida, Hakusan (JP); Masayuki Ishida, Hakusan (JP); Hiroshi Kawai, Hakusan (JP); Mikio Takimoto, Hakusan (JP); Kentaro Nakamura, Meguro-ku (JP)

(73) Assignees: ISHIKAWA PREFECTURE, Ishiwaka (JP); NIKKO COMPANY, Ishikawa (JP); TOKYO INSTITUTE OF TECHNOLOGY, Tokyo (JP)

( * ) Notice: Subject to any disclaimer, the term of this patent is extended or adjusted under 35 U.S.C. 154(b) by 298 days.

(21) Appl. No.: 13/575,544

(22) PCT Filed: Jan. 26, 2011

(86) PCT No.: PCT/JP2011/051417
§ 371 (c)(1),
(2), (4) Date: Jul. 26, 2012

(87) PCT Pub. No.: WO2011/093306
PCT Pub. Date: Aug. 4, 2011

(65) Prior Publication Data
US 2012/0293043 A1 Nov. 22, 2012

(30) Foreign Application Priority Data

Jan. 27, 2010 (JP) .................. 2010-015216

(51) Int. Cl.
*H01L 41/047* (2006.01)
*H01L 41/09* (2006.01)
*H02N 2/00* (2006.01)

(52) U.S. Cl.
CPC .......... *H01L 41/0913* (2013.01); *H01L 41/047* (2013.01); *H02N 2/004* (2013.01)

(58) Field of Classification Search
CPC ....... H02N 2/001; H02N 2/0025; H02N 2/02; H02N 2/10; H01L 41/047; H01L 41/0471
USPC ........................ 310/323.01–323.21, 365, 366
See application file for complete search history.

(56) References Cited

U.S. PATENT DOCUMENTS

| 2006/0175930 A1* | 8/2006 | Ganor et al. .................. 310/317 |
| 2006/0202589 A1* | 9/2006 | Kasai et al. .............. 310/323.13 |
| 2009/0021114 A1 | 1/2009 | Adachi |

FOREIGN PATENT DOCUMENTS

| JP | 3311446 B2 | 8/2002 |
| JP | 2004-297951 A | 10/2004 |

(Continued)

OTHER PUBLICATIONS

Extended European Search Report dated Mar. 6, 2015, issued by the European Patent Office in counterpart European application No. 11737019.7.

*Primary Examiner* — Derek Rosenau
(74) *Attorney, Agent, or Firm* — Sughrue Mion, PLLC

(57) ABSTRACT

Electrodes (7, 8, 9), having curved sections in the shape of the outline thereof, are disposed in areas of a rectangular plate-shaped piezoelectric transducer element (1) in which the strain in the natural mode of vibration is large. The electrodes (7, 8) which excite a bending vibration are disposed in areas in which the strain in the bending natural mode is at least a predetermined value, and the outline curved sections of the electrodes (7, 8) are shaped so as to follow along strain contours (3, 4), and the electrode (9) which excites a stretching vibration is disposed in an area in which the strain in the stretching natural mode is at least a predetermined value, thus providing a transducer for an ultrasonic motor which aims to reduce transducer loss (increasing vibration efficiency), and improve transducer durability and reliability.

14 Claims, 6 Drawing Sheets

(56) References Cited

FOREIGN PATENT DOCUMENTS

| | | |
|---|---|---|
| JP | 2007-028862 A | 2/2007 |
| JP | 2008-054407 A | 3/2008 |
| JP | 2009-284759 A | 12/2009 |
| JP | 2010-004625 A | 1/2010 |

* cited by examiner (a)

(b)

TRANSDUCER FOR ULTRASONIC MOTOR

CROSS REFERENCE TO RELATED APPLICATIONS

This application is a National Stage of International Application No. PCT/JP2011/051417 filed on Jan. 26, 2011, which claims priority from Japanese Patent Application No. 2010-015216, filed on Jan. 27, 2010, the contents of all of which are incorporated herein by reference in their entirety.

TECHNICAL FIELD

The present invention relates to a transducer for an ultrasonic motor, and more particularly, to a transducer for an ultrasonic motor having a structure in which electrodes on a piezoelectric vibration element are disposed independently in polarization regions of bending vibration and stretching vibration, respectively.

BACKGROUND ART

Along with rapid development of electronics and information technology, precision components are required to be smaller and more highly integrated, and hence super precise positioning devices have become necessary, which support inspection or superfine processing in the nano order ($10^{-9}$ m). In addition, in medical or biotechnology research, application technologies by control of proteins or cells have been developed, and hence there are increasing needs for a microscope stage capable of positioning in more precise region. Further, in recent years, together with the demand for higher precision, smaller size and lighter weight of the positioning device and a drive source thereof are also required as objects to be inspected, processed, or measured have become smaller.

As a driving device responding to the needs in such a nano order precise region, an ultrasonic motor using a piezoelectric vibration element as described in Patent Documents 1 to 3 has been developed as an alternative to a conventional electromagnetic motor.

The ultrasonic motor is a driving device based on a drive principle completely different from that of an electromagnetic motor, and has superior features of low speed, high torque, no sound, and high holding power in standstill. In addition, because the transducer has a simple structure, the ultrasonic motor is advantageous for downsizing and is expected as a small actuator.

In general, the ultrasonic motor includes a transducer and a moving body, and functions in a state where a friction contact portion of the transducer is pressed to the moving body with a pressure. In this state, an elliptical motion is generated in the friction contact portion of the transducer so that the friction contact portion sends out the moving body in one way while intermittently pressing the moving body. Working speed of the moving body is controlled by changing amplitude of the elliptical motion.

CITATION LIST

Patent Document

[Patent document 1] JP 2008-54407 A
[Patent document 2] JP 3311446 B
[Patent document 3] JP 2004-297951 A

SUMMARY OF INVENTION

Technical Problem

As described above, the working speed of the moving body driven by the transducer is controlled by changing amplitude of the elliptical motion of the friction contact portion at the tip of the transducer. However, in a normal ultrasonic motor, a locus shape of the elliptical motion cannot be arbitrarily changed. Therefore, when driving at low speed, the amplitude of the elliptical motion becomes small as a whole, and a vibration component in a pressing direction of the transducer for controlling a friction force also becomes small. As a result, an action thereof becomes unstable so as to become a standstill state.

Input and output characteristics of the speed in this case have nonlinearity and a dead zone. With such input and output characteristics, it is difficult to perform stable speed control in a low speed region, and hence accuracy and resolution performance of the motor are deteriorated.

In order to solve the above-mentioned problem, in the above-mentioned Patent Document 1 for example, an electrode region for exciting the bending vibration and an electrode region for exciting the stretching vibration are disposed on all piezoelectric elements to be laminated so that the individual vibrations can be independently controlled. With this structure, amplitudes of the bending vibration and the stretching vibration generating the elliptical motion, and a phase difference therebetween can be separately and arbitrarily adjusted, and hence sufficient vibration in the pressing direction can be obtained even in a low speed region. Therefore, nonlinearity and dead zone of the speed can be eliminated.

Here, in order to effectively excite a predetermined vibration mode, it is desirable to dispose the electrode at a node of the vibration mode, that is, in a region having a large strain in the strain distribution. However, the transducer for an ultrasonic motor described in Patent Document 1 has a rectangular plate-like shape, and includes electrodes having also a rectangular or cross shape. Also in Patent Documents 2 and 3, the piezoelectric elements and the electrodes have rectangular shapes. For this reason, the electrode cannot be disposed appropriately at a position having a large strain in the strain distribution, and hence a loss of vibration efficiency of the transducer is increased. Because the loss of the vibration efficiency causes heat generation in the transducer resulting in temperature rise, stability and reliability are affected badly. Further, by the use of the conventional electrode having a rectangular shape, stress concentration at a corner of the electrode occurs when a voltage is applied, and repeated occurrence of stress due to the vibration causes a fatigue crack and a breakage. Thus, there is a problem that reliability and durability of the transducer is deteriorated.

It is an object of the present invention to solve the above-mentioned problem, and in particular to provide a transducer for an ultrasonic motor in which a transducer loss is reduced (vibration efficiency is increased), and durability and reliability of the transducer are improved.

Means to Solve the Problem

According to the present invention, there is provided (1) a transducer for an ultrasonic motor comprising an electrode having an outline shape including a curved section disposed in a region having a large strain in a natural vibration mode of the rectangular plate-like piezoelectric vibration element.

According to the present invention, there is also provided (2) the transducer for an ultrasonic motor according to 1 above, in which an electrode for exciting bending vibration and an electrode for exciting stretching vibration are disposed separately so that the bending vibration and the stretching vibration are excited independently of each other.

According to the present invention, there is also provided (3) the transducer for an ultrasonic motor as described in (2) above, in which the bending vibration is a second-order bending vibration, and the stretching vibration is a first-order stretching vibration.

According to the present invention, there is also provided (4) the transducer for an ultrasonic motor as described in (2) or (3) above, in which the electrode for exciting bending vibration is disposed in a region where a strain in a bending natural vibration mode is a predetermined value or larger so that an outline curved section of the electrode is substantially along a contour of the strain.

According to the present invention, there is also provided (5) the transducer for an ultrasonic motor described in any one of (2) to (4) above, in which an area of the electrode for exciting bending vibration is 15% or larger and 40% or smaller of the entire area of the piezoelectric vibration element.

According to the present invention, there is also provided (6) the transducer for an ultrasonic motor as described in (2) above, in which the electrode for exciting stretching vibration is disposed in a region where a strain in a stretching natural vibration mode is a predetermined value or larger so that an outline curved section of the electrode is substantially along a contour of the strain.

According to the present invention, there is also provided (7) the transducer for an ultrasonic motor as described in any one of (2), (3), or (6) above, in which an area of the electrode for exciting stretching vibration is 15% or larger and 45% or smaller of the entire area of the piezoelectric vibration element.

According to the present invention, there is also provided (8) the transducer for an ultrasonic motor as described in any one of (4) to (7) above, in which in a case where the electrode for bending vibration and the electrode for stretching vibration interfere with each other, one of the electrode for bending vibration and the electrode for stretching vibration is disposed so that the outline curved section thereof is substantially along the contour of the strain at the interfering position, and the other electrode is disposed to have a gap with the outline section of the one electrode so that both electrodes are insulated from each other.

According to the present invention, there is also provided (9) the transducer for an ultrasonic motor as described in (4) or (5) above, in which the region where the strain in the bending natural vibration mode is the predetermined value or larger is a region where a value of the strain is 0.23 or larger normalized to 1 at the maximum value of the strain when an area of the electrode for bending vibration is 40% of the entire area of the transducer, and is a region where a value of the strain is 0.47 or larger when the area of the electrode for bending vibration is 15% of the entire area of the transducer.

According to the present invention, there is also provided (10) the transducer for an ultrasonic motor as described in (6) or (7) above, in which the area where the strain in the stretching natural vibration mode is the predetermined value or larger is a region where a value of the strain is 0.75 or larger normalized to 1 at the maximum value of the strain when an area of the electrode for stretching vibration is 45% of the entire area of the transducer, and is a region where a value of the strain is 0.95 or larger when the area of the electrode for stretching vibration is 15% of the entire area of the transducer.

Advantageous Effects of Invention

According to the present invention, in the transducer for an ultrasonic motor, a transducer loss to be a cause of temperature increase or heat generation of the transducer can be reduced. In addition, because a part of the outline shape of the electrode includes a curved section substantially along the strain contour, a stress of the transducer generated when a voltage is applied is reduced. Therefore, a fatigue crack or a breakage due to stress concentration is eliminated, and hence durability and reliability of the transducer are improved.

BRIEF DESCRIPTION OF DRAWINGS

FIG. 4 show relationships between an equivalent load resistance to a friction contact portion and an optimal electrode area in the transducer for an ultrasonic motor, in which FIG. 4(a) shows a case of an electrode for first-order stretching vibration, while

FIG. 5 show relationships between the strain and the electrode area in the transducer for an ultrasonic motor according to the present invention, in which FIG. 5(a) shows the electrode area with respect to a value of the strain $\in$ in a case of the second-order bending vibration, while

FIG. 6 are plan views of examples of the present invention in which ground electrodes are formed on one surface of a piezoelectric element, in which FIG. 6(a) illustrates a case where a rectangular ground electrode is disposed on one surface of the element, while

MODE FOR CARRYING OUT THE INVENTION

An embodiment of the present invention has an electrode structure in which a bending natural vibration mode and a stretching natural vibration mode of a piezoelectric vibration element can be excited independently of each other. Further, in order to efficiently generate the bending vibration and the stretching vibration, in an area having a large strain in each of the natural vibration modes, an electrode having an curved outline shape that is partially along the strain contour is disposed so as to be substantially along the strain contour, preferably to be exactly along the same.

EXAMPLES

Next, various examples of the present invention are described with reference to the drawings.

Figure 1:
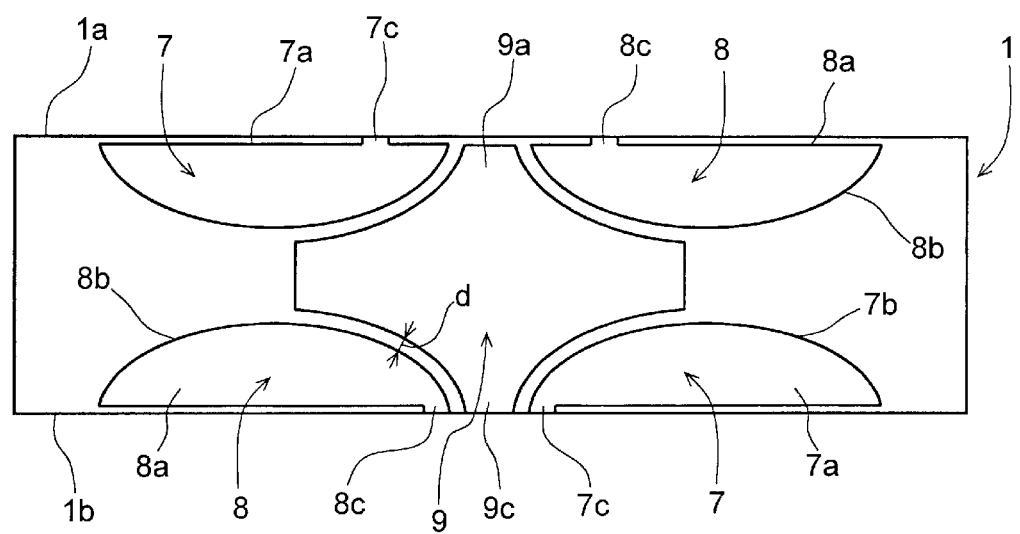
FIG. 1 is a plan view of a transducer for an ultrasonic motor according to examples of the present invention.
Figure 2:
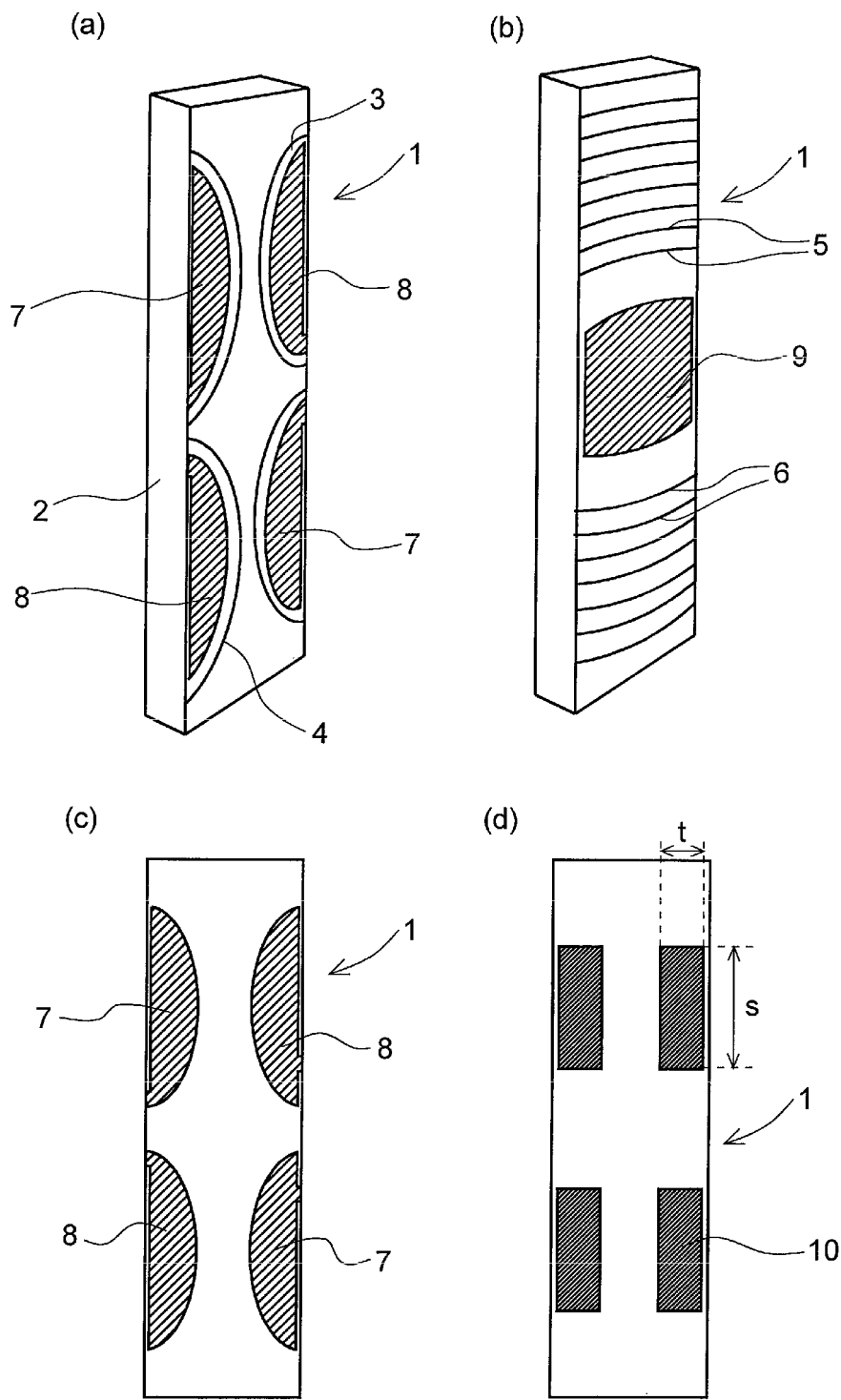
FIG. 2(a) is a perspective view schematically illustrating a strain distribution in a second-order bending natural vibration mode when a voltage is applied to the transducer using a stripe-like pattern.
FIG. 2(b) is a perspective view schematically illustrating a stretching strain distribution in a first-order stretching natural vibration mode when a voltage is applied to the transducer in the same way.

FIG. 1 is a plan view of a transducer for an ultrasonic motor according to examples of the present invention. FIG. 2(a) is a perspective view schematically illustrating a strain distribution in a second-order bending natural vibration mode when a voltage is applied to the transducer using a stripe-like pattern. FIG. 2(b) is a perspective view schematically illustrating a stretching strain distribution in a first-order stretching natural vibration mode similarly. As illustrated in FIG. 2(a), in the second-order bending vibration, the amplitude distribution is a lateral vibration (having an amplitude in the element surface) in which the entire length of a rectangular plate-like piezoelectric element 1 is substantially one wavelength. The strain becomes maximum at a point where the amplitude becomes largest, and this point is located at a position of substantially a fourth from left and right end portions in the longitudinal direction as free ends of the vibration. At this position, the strain expands from a long side portion 2 of the rectangular plate-like piezoelectric element 1 toward the center in the width direction of the element in a convex curved shape. Numerals 3 and 4 represent contour lines of the strain distribution connecting positions having the same strain value in the longitudinal direction.

As illustrated in FIG. 2(b), the first-order stretching vibration is a longitudinal vibration (having an amplitude in the longitudinal direction of the element), in which the entire length of the rectangular plate-like piezoelectric element 1 corresponds to a half the wavelength. Contrary to the bending vibration, the strain becomes maximum at a point where a vibration displacement becomes smallest. Specifically, the strain becomes maximum at the center or its vicinity of the rectangular plate-like piezoelectric element 1, and the strain is distributed from this position toward the free ends in a substantially concentrically curved manner. Numerals 5 and 6 represent contour lines in the first-order stretching vibration.

As described above, electrodes 7 and 8 generating the bending vibration are disposed at the positions where the strain becomes largest, and a pair of the electrodes 7 and 8 is disposed to be opposed to the other pair in the width direction on each surface of the rectangular plate-like piezoelectric element 1. On the other surface opposite to this surface (back surface in the diagram), the same pairs are disposed in the same relationship. In other words, two pairs of the electrodes for bending vibration 7 and 8 are disposed on each surface of the front and back surfaces of the element 1.

In the case of the first-order stretching vibration, an electrode 9 is disposed at the center position in the longitudinal direction of the rectangular plate-like piezoelectric element 1 on each surface of the opposite front and back surfaces.

As described above, the contour lines of the strain distribution are curved lines in both cases of the bending vibration and the stretching vibration. Therefore, the electrodes 7, 8, and 9 having the outline shapes being (partially and) substantially along the curve of the contour lines are disposed.

Figure 3:
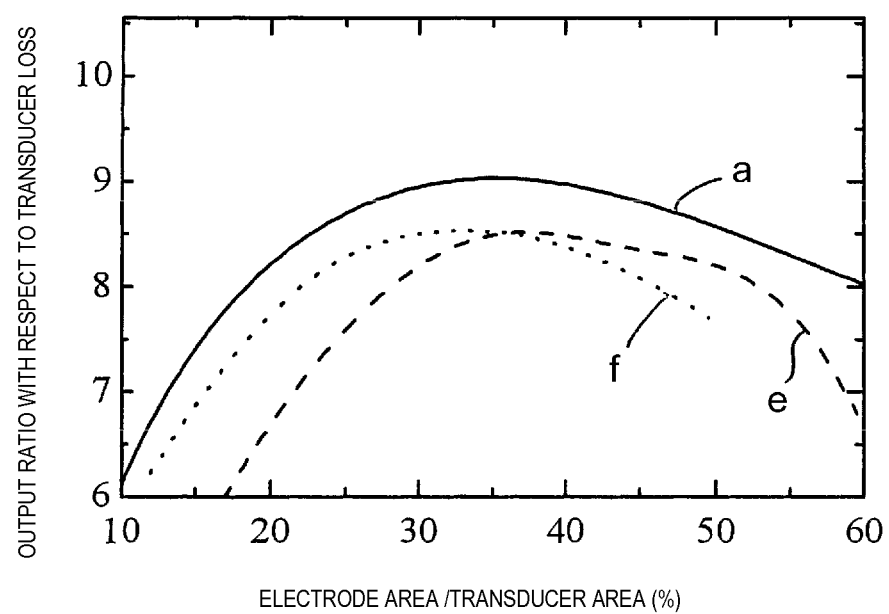
FIG. 3 is a graph showing an output ratio with respect to a transducer loss when electrode area/transducer area (horizontal axis) is changed, in which symbol "a" indicates an output ratio with respect to a transducer 1 of the present invention (FIG. 2(c)) in which electrodes for second-order bending vibration 7 and 8 are formed on a basis of strain of the electrode disposed substantially along a strain contour in the natural vibration mode, and symbols "e" and "f" indicate output ratios when an electrode length s is changed or an electrode width t is changed, respectively, in the transducer 1 (FIG. 2(d)) in which a conventional rectangular electrode 10 is disposed.

Here, output performance with respect to a transducer loss concerning the electrodes for second-order bending vibration 7 and 8 is described by comparison between the electrode of this example having a curved outline shape and a conventional rectangular plate-like electrode 10. FIG. 3 is a graph showing an output ratio with respect to a transducer loss (vertical axis in the graph) when electrode area/transducer area (horizontal axis) is changed. As the output ratio is larger, the transducer loss is smaller. In FIG. 3, symbol "a" indicates an output ratio with respect to the transducer 1 of the present invention (FIG. 2(c)) in which the electrodes for second-order bending vibration 7 and 8 are formed on a basis of strain of the electrode disposed substantially along a strain contour in the natural vibration mode, and illustration of the electrode for stretching vibration is omitted. Symbol e indicates the output ratio when the electrode length s is changed in the transducer 1 with the conventional rectangular plate-like electrode 10 (FIG. 2(d)) (illustration of the electrode for stretching vibration is omitted), and symbol f indicates the output ratio when the electrode width t of the rectangular plate-like electrode 10 is changed. As understood from this graph, the electrode configuration of the present invention disposed in the region in which the strain is a predetermined value or larger (region surrounded by the strain contour line) has a larger ratio than the conventional rectangular plate-like electrode 10 in all range of electrode area/transducer area. Therefore, the electrode shape of the present invention formed on a basis of the strain amplitude is superior. In addition, it is understood from a result of FIG. 3 that there is an electrode area indicating the maximum of the output ratio.

Figure 4A:
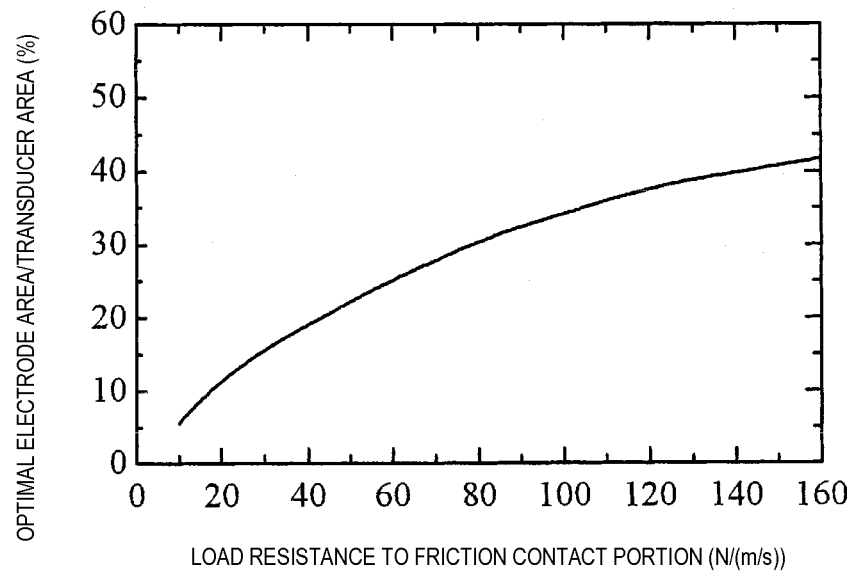
Figure 4B:
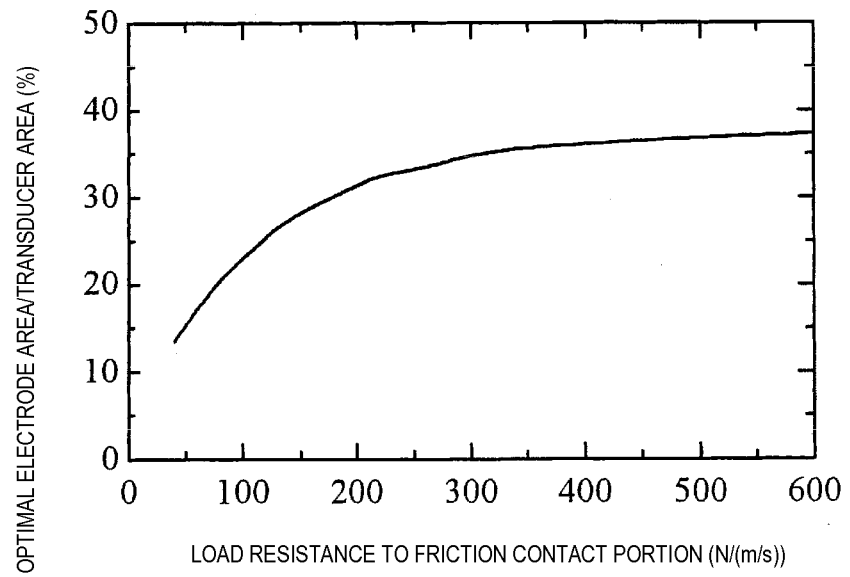
FIG. 4(b) shows a case of an electrode for second-order bending vibration.

The electrode area indicating the maximum output ratio varies depending on a value of the equivalent load resistance at the friction contact portion (tip of the transducer), which is 40% or smaller of the entire area of the transducer at most in the second-order bending vibration, and is 45% or smaller, and preferably 40% or smaller of the entire area of the transducer in the first-order stretching vibration. FIG. 4 show relationships between the equivalent load resistance (N/(m/s)) to the friction contact portion and the optimal electrode area/transducer area (%). FIG. 4(a) shows a case of the electrode for first-order stretching vibration, and FIG. 4(b) shows a case of the electrode for second-order bending vibration. In this way, the optimal electrode area/transducer area (%) changes a little depending on a load resistance to the friction contact portion. In consideration of a practical use, it is appropriate in the present invention that the electrode area of the transducer is 15% to 40% of the entire area of the transducer. Note that, the graph of FIG. 3 shows a result of a case where the equivalent load resistance is approximately 300 N/(m/s). It is supposed that the practical equivalent load resistance varies a little depending on a structure of the motor, which is approximately 50 N/(m/s) in the first-order stretching vibration and is approximately 300 N/(m/s) in the second-order bending vibration. If the electrode area is smaller than 15%, electromechanical transducing efficiency for transducing from electric energy to mechanical energy is reduced, and hence a dielectric loss ratio of the transducer is increased. On the contrary, if the electrode area exceeds 40%, a Q value of the transducer is decreased, and hence a vibration loss and a mechanical loss ratio are increased.

The electrode for bending vibration and the electrode for stretching vibration are disposed in the area where the strain is a predetermined value or larger. The predetermined value in this case varies depending on the area of the disposed electrode. For instance, in a case of the second-order bending vibration, when the maximum value of the strain is normalized to 1, the predetermined value is 0.47 or larger when the electrode area is 15% of the entire area of the element, and the predetermined value is 0.23 or larger when the electrode area is 40%. Therefore, in the vibration in which the electrode area is set to 40% to 15%, the electrode is disposed in the region in which the strain value is 0.23 to 0.47 or larger.

In the first-order stretching vibration, the electrode is disposed in the region where the strain value is 0.95 or larger when the electrode area is 15%, and the electrode is disposed in the region where the strain value is 0.75 or larger when the electrode area is 45% (the strain value is normalized at the maximum value to one).

Figure 5A:
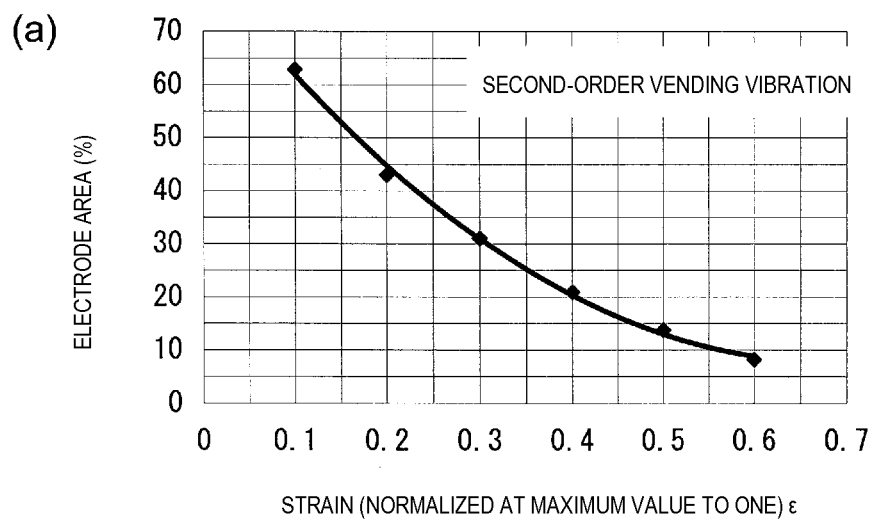
Figure 5B:
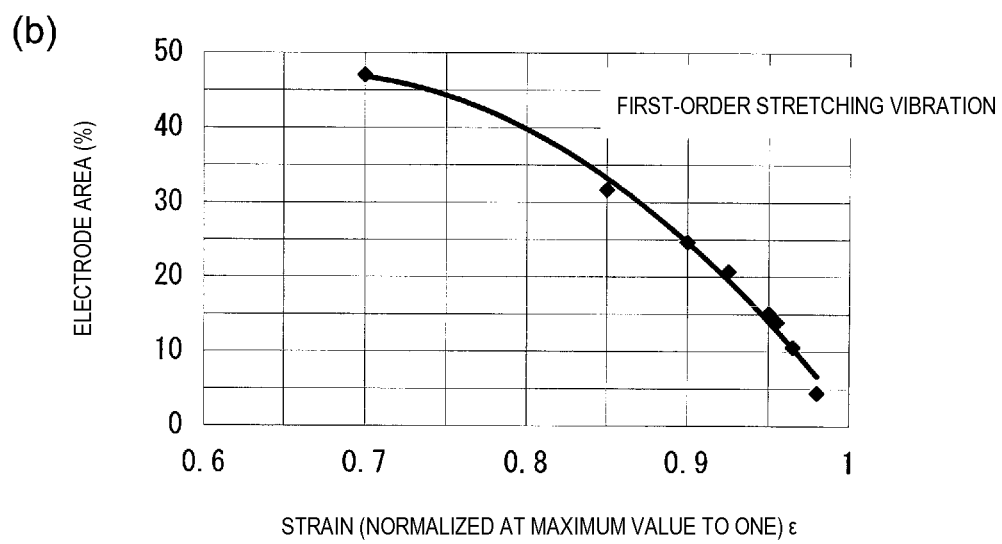
FIG. 5(b) shows the electrode area with respect to the value of the strain $\in$ in a case of the first-order stretching vibration.

FIG. 5 are graphs showing relationships between the strain and the electrode area, in which FIG. 5(a) shows the electrode area (%) with respect to a value of strain $\in$ in a case of the second-order bending vibration, and FIG. 5(b) shows the electrode area (%) with respect to a value of strain $\in$ in a case of the first-order stretching vibration (the strain value is normalized at the maximum value to one).

An electrode arrangement structure of the transducer for an ultrasonic motor of the example illustrated in FIG. 1 is described specifically.

The electrodes for second-order bending vibration 7 and 8, in which outer rims 7a and 8a thereof are adjacent to a long side portion 1a of the rectangular plate-like piezoelectric element 1 in parallel, and inner rims 7b and 8b thereof are formed to have a curved shape along the above-mentioned strain contour of a predetermined value, are disposed in a form of two pairs on each surface (two opposing pairs on each of the front and back surfaces). In addition, on the surface of the piezoelectric element 1, there are formed connecting portions 7c and 8c to be connected to external electrodes (not shown) at positions in the long side portion 1a illustrated in FIG. 1. The electrode on the back surface of the piezoelectric element 1 is connected to an external electrode (not shown) other than the external electrode connected to the front surface side. The electrodes 7 and 8 constituting pairs on each surface are driven by opposite phases so that the second-order bending vibration is excited. In this example, the electrode area for second-order bending vibration is 34% of the entire area of the transducer. Therefore, as the strain contour on the surface of the element along which the electrode curved section is disposed, a position of the strain of approximately 0.25 or larger is selected (see FIG. 5(a)).

The electrode 9 for first-order stretching vibration is disposed at the same center position on both the front and the back surfaces of the rectangular plate-like piezoelectric element 1. On the front surface side, an electrode outer side portion 9a is adjacent to the long side portion 1a of the element 1, and a connecting portion 9c to be connected to the external electrode is formed on the other long side portion 1b of the element 1. On the back surface (not shown) of the element 1, the electrode outer side portion is formed as a connecting portion to be connected to another external electrode on the long side portion 1a of the element 1, and the back surface electrode is made to be adjacent to the other long side portion 1b of the element 1.

The electrode for first-order stretching vibration is also basically disposed so as to be substantially along the stretching strain contour of a predetermined value or larger. If the electrode for first-order stretching vibration is placed in a position where it interferes with the electrode for second-order bending vibration, a region in a part having no interference in which the strain of the stretching vibration is as large as possible is selected for the arrangement. In the example of FIG. 1, the electrode for first-order stretching vibration 9 is formed to have a curve along the curved shape portion of the electrodes for bending vibration 7 and 8, and is arranged with a space d to have sufficient insulation to the electrodes for second-order bending vibration 7 and 8. In this example, the area of the electrode for stretching vibration 9 is approximately 20% of the entire area of the transducer. In this case, the space d between the electrode for bending vibration and the electrode for stretching vibration is 0.2 to 0.5 mm for securing the insulating property.

In the example of FIG. 1, in order to avoid interference between the electrode for stretching vibration 9 and the electrodes for bending vibration 7 and 8, the electrodes for bending vibration 7 and 8 are made to be along the strain contour in priority, but on the contrary it is possible to adopt the following structure. The electrode for stretching vibration 9 is disposed in priority so that both ends in the longitudinal direction of the electrode for stretching vibration 9 are substantially along the stretching strain contour, and the electrodes for bending vibration 7 and 8 are disposed adjacent to the electrode for stretching vibration 9 with sufficient space capable of securing insulating property.

Figure 6A:
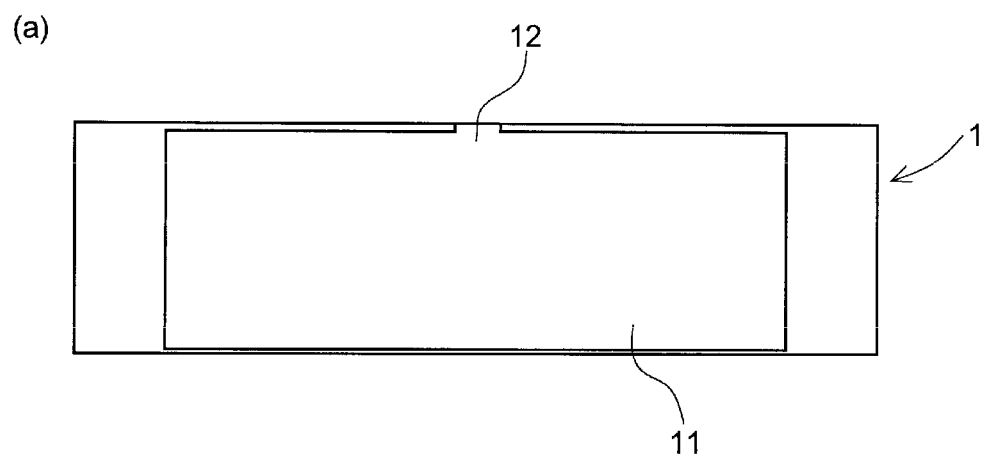
Figure 6B:
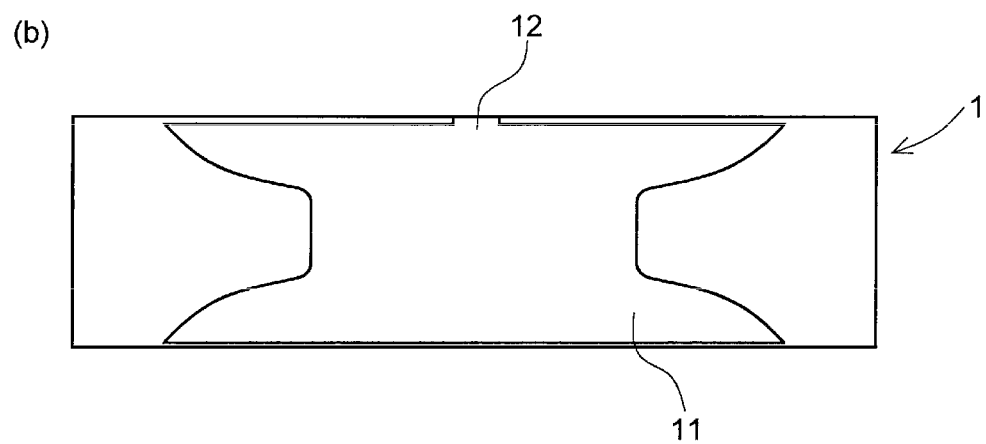
FIG. 6(b) illustrates a case where a ground electrode having an outline shape partially along a curved surface of the electrode for bending vibration is disposed.

In the above-mentioned example, the electrode for bending vibration and the electrode for stretching vibration are disposed on each of the front and back surfaces of the rectangular plate-like piezoelectric element. However, as illustrated in FIG. 6 as other examples, instead of disposing the electrodes for bending vibration and stretching vibration, a common ground electrode 11 may be formed on one surface, for example, on the back surface of the rectangular plate-like piezoelectric element 1, which corresponds to both the electrodes on the front surface, and may be connected to an external earth electrode (not shown). In this case, the ground electrode 11 has a shape and a size sufficient to cover an area of electrodes for bending vibration and for stretching vibration on the opposite surface of the element. FIG. 6(a) illustrates a case where a rectangular ground electrode is disposed on one surface of the element, and FIG. 6(b) illustrates a case where a ground electrode having an outline shape partially along a curved portion of the electrode for bending vibration is disposed. Numeral 12 represents a connecting portion disposed on the ground electrode 11, which is connected to the external earth electrode.

As to the electrode for the transducer of the present invention, each of the electrodes for bending vibration and for stretching vibration has a part having a curved shape. Therefore, unlike the conventional rectangular or cross-shaped electrode, stress concentration at a corner due to the vibration is suppressed, and hence a crack or a breakage due to repeated stress can be prevented. In particular, because a large stress is generated between the electrode for bending vibration and the electrode for stretching vibration, if the shape of the space between the both electrodes is a smooth curve as in the transducer according to the present invention, the stress concentration hardly occurs, and hence a transducer for an ultrasonic motor superior in durability and reliability can be provided. Because the electrode has a curved shape along the strain contour, the electrode can be optimally disposed at a position having a large strain in the strain distribution which offers many advantages such that a transducer loss can be minimized.

In this way, examples of the embodiment in which the electrode for second-order bending vibration and the electrode for first-order stretching vibration are independently excited are described above. However, the piezoelectric transducer may be a rectangular plate-like transducer of other vibration mode as long as the electrode of the transducer, which has an electrode shape including a curve along the strain contour, is disposed in a region where the strain in the natural vibration mode is large. Here, in a high order mode, an absolute value of the amplitude is decreased in general, and hence it becomes difficult to excite the stretching vibration and the bending vibration independently. In addition, an electrode arrangement becomes complicated. Therefore, it is preferred that the present invention be applied to a transducer in which the first-order stretching vibration and the second-order bending vibration are combined.

REFERENCE SIGNS LIST 1 rectangular plate-like piezoelectric element
2 long side portion of element
3, 4 contour line of bending vibration strain
5, 6 contour line of stretching vibration strain
7, 8 electrode for second-order bending vibration
9 electrode for first-order stretching vibration
11 ground electrode
12 connecting portion on the ground electrode for earthing

The invention claimed is:

1. A transducer for an ultrasonic motor comprising an electrode having an outline shape including a curved section provided on a rectangular plate-like piezoelectric vibration element,
   wherein an electrode for exciting bending vibration and an electrode for exciting stretching vibration are disposed separately such that the bending vibration and the stretching vibration are excited independently of each other, and
   wherein the electrode for exciting bending vibration is disposed in a region where a strain in a bending natural vibration mode is a predetermined value or larger,
   wherein the strain has a contour having a first end and a second end opposite the first end, and
   wherein an outline curved section of the electrode for exciting bending vibration follows the contour of the strain from the first end to the second end.

2. The transducer for an ultrasonic motor as described in claim 1, in which the bending vibration is a second-order bending vibration, and the stretching vibration is a first-order stretching vibration.

3. The transducer for an ultrasonic motor described in claim 1, in which an area of the electrode for exciting bending vibration is 15% or larger and 40% or smaller of the entire area of the piezoelectric vibration element.

4. The transducer for an ultrasonic motor as described in claim 1, in which the electrode for exciting stretching vibration has an outline curved section which follows a contour of a strain in a stretching natural vibration mode from one end point to another end point and is disposed in a region where the strain in the stretching natural vibration mode is a predetermined value or larger so that the outline curved section of the electrode is substantially along a contour of the strain.

5. The transducer for an ultrasonic motor as described in claim 4, in which an area of the electrode for exciting stretching vibration is 15% or larger and 45% or smaller of the entire area of the piezoelectric vibration element.

6. The transducer for an ultrasonic motor as described in claim 1, wherein as a result of the electrode for bending vibration and the electrode for stretching vibration interfering with each other, one of the electrode for bending vibration and the electrode for stretching vibration is disposed so that the outline curved section thereof is substantially along the contour of the strain at an interfering position, and the other electrode is disposed to have a gap with the outline section of the one electrode so that both electrodes are insulated from each other.

7. The transducer for an ultrasonic motor as described in claim 1, wherein the region where the strain in the bending natural vibration mode is the predetermined value or larger is a region where a value of the strain is 0.23 or larger normalized to 1 at the maximum value of the strain as a result of an area of the electrode for bending vibration is 40% of the entire area of the transducer, and is a region where a value of the strain is 0.47 or larger when the area of the electrode for bending vibration is 15% of the entire area of the transducer.

8. The transducer for an ultrasonic motor as described in claim 4, wherein the area where the strain in the stretching natural vibration mode is the predetermined value or larger is a region where a value of the strain is 0.75 or larger normalized to 1 at the maximum value of the strain as a result of an area of the electrode for stretching vibration is 45% of the entire area of the transducer, and is a region where a value of the strain is 0.95 or larger when the area of the electrode for stretching vibration is 15% of the entire area of the transducer.

9. The transducer for an ultrasonic motor as described in claim 2, wherein as a result of the electrode for bending vibration and the electrode for stretching vibration interfering with each other, one of the electrode for bending vibration and the electrode for stretching vibration is disposed so that the outline curved section thereof is substantially along the contour of the strain at an interfering position, and the other electrode is disposed to have a gap with the outline section of the one electrode so that both electrodes are insulated from each other.

10. The transducer for an ultrasonic motor as described in claim 3, wherein as a result of the electrode for bending vibration and the electrode for stretching vibration interfering with each other, one of the electrode for bending vibration and the electrode for stretching vibration is disposed so that the outline curved section thereof is substantially along the contour of the strain at an interfering position, and the other electrode is disposed to have a gap with the outline section of the one electrode so that both electrodes are insulated from each other.

11. The transducer for an ultrasonic motor as described in claim 4, wherein as a result of the electrode for bending vibration and the electrode for stretching vibration interfering with each other, one of the electrode for bending vibration and the electrode for stretching vibration is disposed so that the outline curved section thereof is substantially along the contour of the strain at an interfering position, and the other electrode is disposed to have a gap with the outline section of the one electrode so that both electrodes are insulated from each other.

12. The transducer for an ultrasonic motor as described in claim 5, wherein as a result of the electrode for bending vibration and the electrode for stretching vibration interfering with each other, one of the electrode for bending vibration and the electrode for stretching vibration is disposed so that the outline curved section thereof is substantially along the contour of the strain at an interfering position, and the other electrode is disposed to have a gap with the outline section of the one electrode so that both electrodes are insulated from each other.

13. The transducer for an ultrasonic motor as described in claim 3, wherein the region where the strain in the bending natural vibration mode is the predetermined value or larger is a region where a value of the strain is 0.23 or larger normalized to 1 at the maximum value of the strain as a result of an area of the electrode for bending vibration is 40% of the entire area of the transducer, and is a region where a value of the strain is 0.47 or larger when the area of the electrode for bending vibration is 15% of the entire area of the transducer.

14. The transducer for an ultrasonic motor as described in claim 5, wherein the area where the strain in the stretching natural vibration mode is the predetermined value or larger is a region where a value of the strain is 0.75 or larger normalized to 1 at the maximum value of the strain as a result of an area of the electrode for stretching vibration is 45% of the entire area of the transducer, and is a region where a value of the strain is 0.95 or larger when the area of the electrode for stretching vibration is 15% of the entire area of the transducer.

* * * * *